United States Patent
Fan et al.

(10) Patent No.: US 11,595,030 B2
(45) Date of Patent: Feb. 28, 2023

(54) RAMP GENERATOR PROVIDING HIGH RESOLUTION FINE GAIN INCLUDING FRACTIONAL DIVIDER WITH DELTA-SIGMA MODULATOR

(71) Applicant: OMNIVISION TECHNOLOGIES, INC., Santa Clara, CA (US)

(72) Inventors: Lihang Fan, Sunnyvale, CA (US); Liang Zuo, San Mateo, CA (US); Nijun Jiang, Shanghai (CN); Min Qu, Mountain View, CA (US); Xuelian Liu, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 258 days.

(21) Appl. No.: 16/867,399

(22) Filed: May 5, 2020

(65) Prior Publication Data
US 2021/0351768 A1     Nov. 11, 2021

(51) Int. Cl.
| | |
|---|---|
| *H03K 4/06* | (2006.01) |
| *H04N 5/378* | (2011.01) |
| *H03M 1/56* | (2006.01) |
| *H03M 3/00* | (2006.01) |

(52) U.S. Cl.
CPC .............. *H03K 4/066* (2013.01); *H03M 1/56* (2013.01); *H03M 3/39* (2013.01); *H04N 5/378* (2013.01)

(58) Field of Classification Search
CPC ........... H03M 1/56; H03M 3/39; H04N 5/378
See application file for complete search history.

(56) References Cited

U.S. PATENT DOCUMENTS

| | | | |
|---|---|---|---|
| 10,554,912 B2* | 2/2020 | Nagai | H03M 1/0863 |
| 2004/0164809 A1 | 8/2004 | Gibbs | |
| 2009/0079603 A1* | 3/2009 | Maruyama | H03K 5/249 |
| | | | 341/122 |
| 2016/0322979 A1 | 11/2016 | Upadhyaya et al. | |
| 2019/0289236 A1 | 9/2019 | Kim | |

OTHER PUBLICATIONS

"15-25 MHz Fractional-N Synthesizer," http://www.aholme.co.uk/Frac2/Mash.htm, 5 pages, Andrew Holme, 2005.

(Continued)

*Primary Examiner* — Twyler L Haskins
*Assistant Examiner* — Fayez A Bhuiyan
(74) *Attorney, Agent, or Firm* — Perkins Coie LLP

(57) ABSTRACT

A ramp generator providing ramp signal with high resolution fine gain includes a current mirror having a first and second paths to conduct a capacitor current and an integrator current responsive to the capacitor current. First and second switched capacitor circuits are coupled to the first path. A fractional divider circuit is coupled to receive a clock signal to generate in response to an adjustable fractional divider ratio K a switched capacitor control signal that oscillates between first and second states to control the first and second switched capacitor circuits. The first and second switched capacitor circuits are coupled to be alternatingly charged by the capacitor current and discharged in response to each the switched capacitor control signal. An integrator coupled is to the second path to generate the ramp signal in response to the integrator current.

23 Claims, 5 Drawing Sheets

(56) References Cited

OTHER PUBLICATIONS

"Efficient Dithering in MASH Sigma-Delta Modulators for Fractional Frequency Synthesizers," IEEE Transactions on Circuits and Systems—I: Regular Papers, vol. 57, No. 9, Sep. 2010, 10 pages.
"New OmniVision 48MP Image Sensor Provides Unparalleled High Dynamic Range and 4K Video Performance for Flagship Mobile Phones," Jan. 6, 2020, 1 page.
"OV48C 48-megapixel product brief," Jan. 2020, 2 pages.
"Self-Dithered Digital Delta-Sigma Modulators for Fractional-N PLL," Zule Xu, Jun Gyu Lee, and Shoichi Masui, Research Institute of Electrical Communication, Tohoku University, 2011, 4 pages.
Taiwanese Office Action dated Oct. 26, 2021, issued in corresponding Application No. 110116005, filed May 4, 2021, 23 pages.

\* cited by examiner

RAMP GENERATOR PROVIDING HIGH RESOLUTION FINE GAIN INCLUDING FRACTIONAL DIVIDER WITH DELTA-SIGMA MODULATOR

BACKGROUND INFORMATION

Field of the Disclosure

This disclosure relates generally to image sensors, and in particular but not exclusively, relates to ramp generators utilized in image sensors.

Background

Image sensors have become ubiquitous and are now widely used in digital cameras, cellular phones, security cameras, as well as medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixel cells having photosensitive elements (e.g., photodiodes) that absorb a portion of the incident image light and photogenerate image charge upon absorption of the image light. The image charge photogenerated by the pixel cells may be measured as analog output image signals on column bit lines that vary as a function of the incident image light. In other words, the amount of image charge generated is proportional to the intensity of the image light, which is read out as analog signals from the column bit lines and converted to digital values to produce digital images (i.e., image data) representing the external scene.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
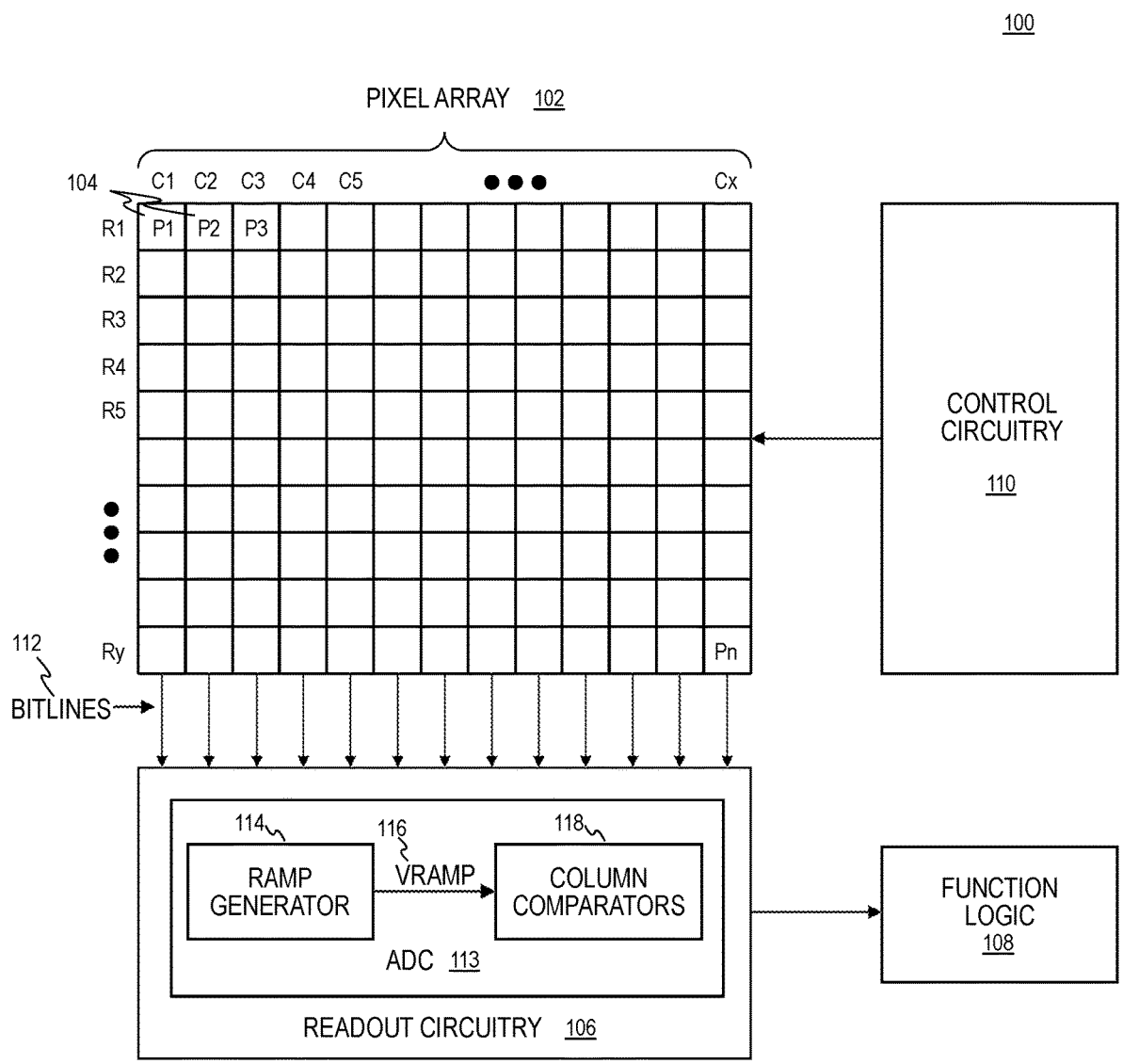
FIG. 1 illustrates one example of an imaging system including an image sensor with readout circuitry including a ramp generator having high resolution analog fine gain using a fractional divider with a delta-sigma modulator in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Various examples directed to an imaging system including an image sensor with readout circuitry including a ramp generator having high resolution analog fine gain using a fractional divider with a delta-sigma modulator are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, examples of an imaging system including readout circuitry including a ramp generator having high resolution analog fine gain using a fractional divider with a delta-sigma modulator are disclosed. In the various examples, it is appreciated that ultra-high resolution fine gain is achieved with little to no penalty in power consumption or chip area. For instance, in one example, a fine gain resolution of $1/2^{20}$ can be achieved with an area of approximately 40 μm×100 μm and less than 1 mW of power consumption in a 40 nm process in accordance with the teachings of the present invention.

To illustrate, FIG. 1 illustrates one example of an imaging system 100 in accordance with an embodiment of the present disclosure. Imaging system 100 includes pixel array 102, control circuitry 110, readout circuitry 106, and function logic 108. In one example, pixel array 102 is a two-dimensional (2D) array of pixel cells 104 that include one or more photodiodes (e.g., pixels P1, P2 ..., Pn). As illustrated in the example, the pixel cells 104 are arranged into rows (e.g., rows R1 to Ry) and columns (e.g., column C1 to Cx) to acquire image data of a person, place, object, etc., which can then be used to render a 2D image of the person, place, object, etc. It is appreciated, however, that pixel cells 104 do not necessarily have to be arranged into rows and columns and may take other configurations.

In one example, control circuitry 110 is coupled to pixel array 102 to control operation of the plurality of pixel cells 104 in pixel array 102. For example, control circuitry 110 may generate a shutter signal for controlling image acquisition. In one example, the shutter signal is a global shutter signal for simultaneously enabling all pixel cells 104 within pixel array 102 to simultaneously capture their respective image data during a single acquisition window. In another example, the shutter signal is a rolling shutter signal such that each row, column, or grouping of pixel cells 104 is sequentially enabled during consecutive acquisition windows. In another example, image acquisition is synchronized with lighting effects such as a flash, etc.

In one example, imaging system 100 may be included in a digital camera, cell phone, laptop computer, or the like. Additionally, imaging system 100 may be coupled to other pieces of hardware such as a processor (general purpose or otherwise), memory elements, outputs (USB port, wireless transmitter, HDMI port, etc.), lighting/flash, electrical input devices (keyboard, touch display, trackpad, mouse, microphone, etc.), and/or display. Other pieces of hardware may deliver instructions to imaging system 100, extract image data from imaging system 100, and/or manipulate image data supplied by imaging system 100.

In one example, after each pixel cell 104 in pixel array 102 has acquired its image charge through photogeneration of the image charge, corresponding image data is readout by readout circuitry 106 and is then transferred to function logic 108. Readout circuitry 106 may be coupled to readout image data from the plurality of pixel cells 104 in pixel array 102. In the illustrated example, readout circuitry 106 may include analog to digital conversion (ADC) circuitry 113, amplification circuitry, as well as other image sensing readout circuitry. In the illustrated example, a ramp generator 114 and column comparators 118 may be included in the readout circuitry 106. In some embodiments, there may be a column comparator 118 for each readout column, and the ramp generator 114 may be coupled to provide a ramp signal VRAMP 116 to each column comparator 118. Function logic 108 may be coupled to readout circuitry 106 simply to store the image data, or even manipulate the image data by applying post image effects (e.g., crop, rotate, remove red eye, adjust brightness, adjust contrast, or otherwise). In one example, readout circuitry 106 may read out a row of image data at a time along bitlines 112 (illustrated), or may read out the image data using a variety of other techniques (not illustrated), such as a serial readout or a full parallel readout of all pixel cells 104 simultaneously.

In the depicted example, the ADC 113 included in readout circuitry 106 is a ramp type ADC that performs analog to digital conversion using the ramp generator 114 to provide a ramp signal VRAMP 116 as a reference to a column comparator 118 associated with each readout column. For a ramp type ADC, a counter (not illustrated) starts to count when a ramp in the ramp signal VRAMP 116 begins and is compared to the analog image signal. At the point when the ramp signal VRAMP 116 and the analog image signal are equal, the value of the counter is latched as digital representation of the analog image signal.

In one example, in order to realize an image sensor with high resolution analog to digital conversion, the gain of the ramp signal VRAMP 116 is adjusted. The gain of the ramp signal VRAMP 116 is the ratio of the ramp slope, which is defined in Equation (1) below:

$$\text{GAIN} = \frac{(\text{Slope})|_{gain=1}}{\text{Slope}} \quad (1)$$

Thus, the gain of a ramp signal is equal to the slope of a ramp signal with a gain equal to 1 divided by the slope of the ramp signal. In other words, the gain is inversely proportional to the slope, or:

$$\text{GAIN} \propto 1/\text{Slope} \quad (2)$$

Analog coarse gain adjustments may be performed in array column circuits (e.g., 1×, 2×, 4×, 8× adjustments) while analog fine gain adjustments may be performed in within the ramp generators. One of the challenges with performing analog fine gain adjustments in the ramp generators is that there are typically only a limited number of fine gain adjustment steps that can be performed, such as for instance 1/16 adjustments. With such a limited number of fine gain adjustment steps (e.g., 1/16 adjustments) in the ramp generator, there are large gain errors, especially at higher gain values.

Figure 2:
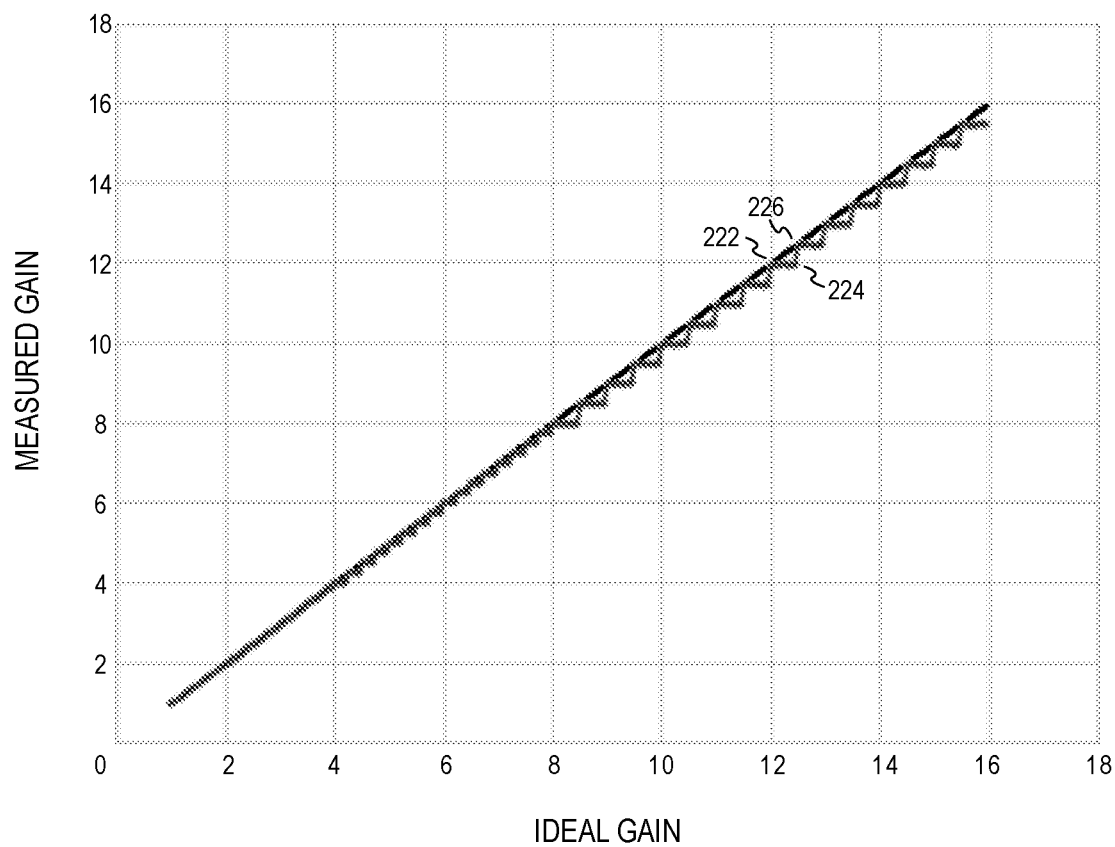
FIG. 2 is a graph illustrating ideal gain relative to measured gain of an example of a ramp generator without high resolution analog fine gain using a fractional divider with a delta-sigma modulator in accordance with the teachings of the present invention.

To illustrate, FIG. 2 is a graph 220 that shows ideal gain relative to measured gain of an example of a ramp generator with only a limited number of fine gain adjustment steps as described above. As illustrated in the example of FIG. 2, ideal gain is shown as the smooth diagonal line, while the measured gain of a ramp generator with limited steps of fine gain adjustments is the "staircase" line with "steps" that become increasingly prominent as gain increases. In a ramp generator with such limited gain steps, the relative distances between the diagonal ideal gain graph and the measured gain graph with steps are not equal and get worse as gain increases. In other words, the distance of the real steps 222 and 226 to the ideal diagonal line are not equal to the distance of point 224 of the measured gain to the ideal diagonal line. Consequently, there is a large gain error at point 224 of the measured gain graph.

Figure 3A:
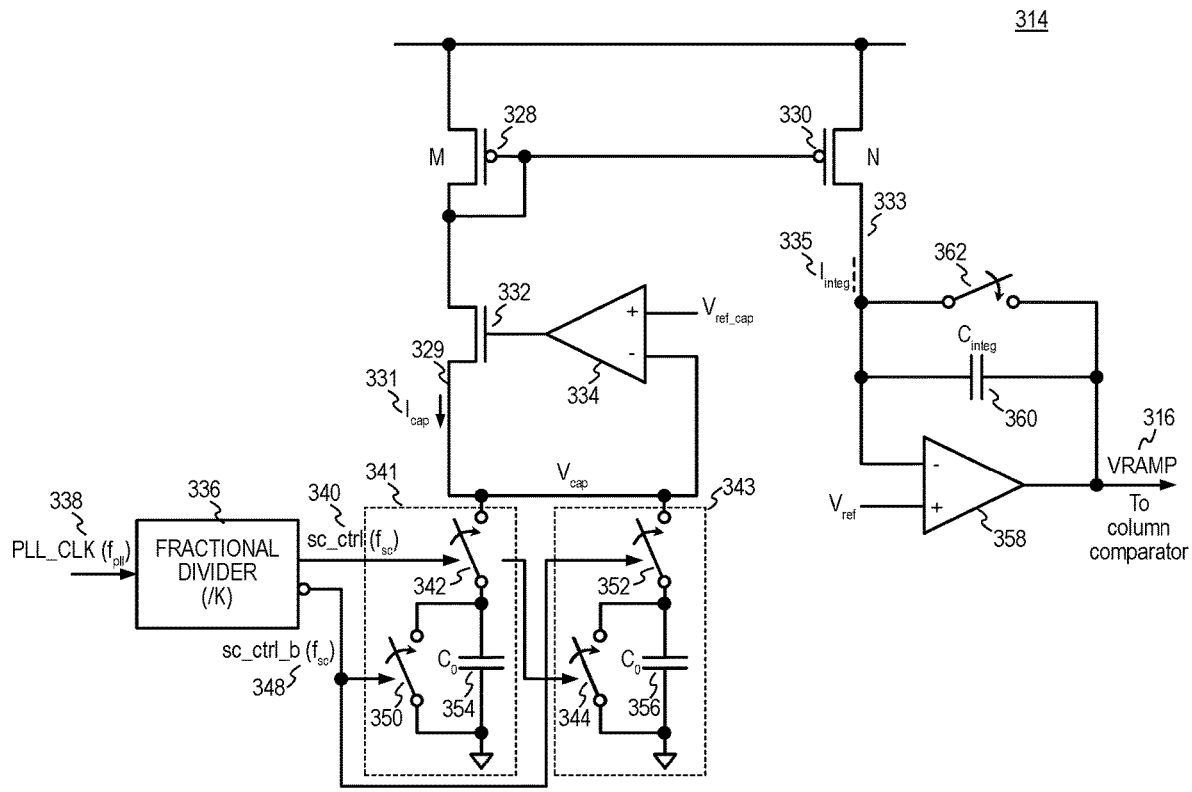
FIG. 3A illustrates a one example of a ramp generator having high resolution analog fine gain using a fractional divider with a delta-sigma modulator in accordance with the teachings of the present disclosure.

As will be described below, a ramp generator in accordance with the teachings of the present invention utilizes a delta-sigma modulator divider to achieve ultra-high resolution fine gain steps. To illustrate, FIG. 3A illustrates a one example of a ramp generator 314 having high resolution analog fine gain using a fractional divider with a delta-sigma modulator in accordance with the teachings of the present disclosure. It is appreciated the ramp generator 314 of FIG. 3A may be one example of the ramp generator 114 in readout circuitry 106 of the image sensor 100 as shown in FIG. 1, and that similarly named and numbered elements described above are coupled and function similarly below.

As illustrated in the depicted example, ramp generator 314 includes a current mirror that includes transistors 328 and 330, which have their gate terminals coupled to each other as shown. In the example, transistors 328 and 330 are P channel metal oxide semiconductor field effect transistors (MOSFETs). In other examples, it is appreciated that other that other types of transistors may be utilized to realize a current mirror. In the example, the source terminal of transistor 328 is coupled a voltage supply rail and the gate and drain terminals of transistor 328 are coupled together. The source terminal of transistor 330 is coupled to the voltage supply rail. As such the current mirror has a first current mirror path 329 coupled to transistor 328 and a second current mirror path 333 coupled to transistor 330. In the example, the transistor 328 has a relative channel width proportional to M and the transistor 330 has a relative channel width proportional to N. As such, a capacitor current $I_{cap}$ 331 is conducted through the first path 321 and a mirrored integrator current $I_{integ}$ 335 is conducted through the second path 333 according to the N/M ratio of the first and second transistors 328 and 330.

As shown in the example of FIG. 3A, a first switched capacitor circuit 341 and a second switched capacitor circuit 343 are coupled to the first path 329. The first switched capacitor circuit 341 includes a switch 342, a first capacitor 354, and a switch 350 coupled as shown. The second switched capacitor circuit 343 includes a switch 352, a second capacitor 356, and a switch 344 coupled as shown.

The depicted example also illustrates that ramp generator 314 includes a fractional divider circuit 336. In the example, the fractional divider circuit 336 has an adjustable fractional divider ratio K, which provides the ramp generator 314 with high resolution analog fine gain in accordance with the teachings of the present invention. The fractional divider circuit 336 is coupled to receive a clock signal PLL_CLK ($f_{pll}$) 338, which is utilized to generate in response to the adjustable fractional divider ratio K a switched capacitor control signal sc_ctrl ($f_{sc}$) 340. The switched capacitor control signal sc_ctrl ($f_{sc}$) 340 oscillates between first and second states (e.g., on and off states, or logic high and logic low states) to control switching of the first and second switched capacitor circuits 341 and 343. In operation, the first switched capacitor circuit 341 is coupled to be charged by the capacitor current $I_{cpp}$ 331 while the second switched capacitor circuit 343 is coupled to be discharged in response to each first state of the switched capacitor control signal 340. The first switched capacitor circuit 341 is coupled to be discharged while the second switched capacitor circuit 343 is coupled to be charged by the capacitor current $I_{cpp}$ 331 in response to each second state of the switched capacitor control signal 340.

In the depicted example, the fractional divider circuit 336 is also coupled to generate a switched capacitor control signal sc_ctrl_b ($f_{sc}$) 348 that oscillates between the second and first states (e.g., off and on states, or logic low and logic high states) to control the first and second switched capacitor circuits 341 and 343. In one example, the switched capacitor control signal sc_ctrl_b ($f_{sc}$) 348 is generated in response to switched capacitor control signal sc_ctrl ($f_{sc}$) 340 such that only one of the two signals can be in the first state (e.g., an on state) at a time. In one example, the switched capacitor control signal sc_ctrl 340 and switched capacitor control signal sc_ctrl_b 348 are complements of each other, or in another example the switched capacitor control signal sc_ctrl 340 and switched capacitor control signal sc_ctrl_b 348 are out of phase with one another such that neither of the two signals can ever be in the first state at the same time. In addition, both the switched capacitor control signal sc_ctrl 340 and switched capacitor control signal sc_ctrl_b 348 have the same frequency of $f_{sc}$.

Therefore, in the example depicted in FIG. 3A, switches 342 and 344 are coupled to be turned on in response to switched capacitor control signal sc_ctrl ($f_{sc}$) 340 being in the first state to charge capacitor 354 and discharge capacitor 356. At the same time switches 350 and 352 are coupled to be turned off in response to switched capacitor control signal sc_ctrl_b ($f_{sc}$) 348 being in the second state of to enable capacitor 354 to be charged and to decouple capacitor 356 from being charged. Similarly, switches 350 and 352 are coupled to be turned on in response to switched capacitor control signal sc_ctrl_b ($f_{sc}$) 348 being in the first state to discharge capacitor 354 and to charge capacitor 356. At the same time, switches 342 and 344 are coupled to be turned off in response to switched capacitor control signal sc_ctrl ($f_{sc}$) 340 being in the second state to decouple capacitor 354 from being charged and enable capacitor 356 to be charged. Therefore, capacitors 354 and 356 are alternatingly charged and discharged in response to switched capacitor control signal sc_ctrl ($f_{sc}$) 340 and switched capacitor control signal sc_ctrl_b ($f_{sc}$) 348.

In the illustrated example, ramp generator 314 also includes an operational amplifier 334 having a non-inverting input coupled to a reference capacitor voltage $V_{ref\_cap}$. A transistor 332 is coupled between the transistor 328 and the first switched capacitor circuit 341, the second switched capacitor circuit 343, and the inverting input of the operational amplifier 334 through the current path 329. The control terminal (e.g., gate) of the transistor 332 is coupled to an output of the operational amplifier 334. Accordingly, the operational amplifier 334 is coupled to turn off the transistor 332 in response to a voltage $V_{cap}$ at the first switched capacitor circuit 341 or the second switched capacitor circuit 343 reaching the reference capacitor voltage $V_{ref\_cap}$. As such, the operational amplifier 334 and the transistor 332 are coupled to turn off the charging capacitor current $I_{cpp}$ 331 through the current path 329 once the $V_{cap}$ voltage at first and second switched capacitor circuits 341 or 343 are fully charged to the $V_{ref\_cap}$ reference voltage.

The depicted example also illustrates that ramp generator 314 includes an integrator coupled to the current path 333 to generate the ramp signal VRAMP 326 in response to the integrator current $I_{integ}$ 335. In one example, the ramp signal VRAMP 326 is coupled to be received by a column comparator, such as column comparator 118 illustrated in FIG. 1. As shown in the example illustrated in FIG. 3A, the integrator includes an operational amplifier 358 having a non-inverting input coupled to a reference voltage $V_{ref}$. A capacitor $C_{integ}$ 360 is coupled between an inverting input of the operational amplifier 358 and an output of the operational amplifier 358. A switch 362 is coupled between the inverting input of the operational amplifier 358 and the output of the operational amplifier 358. The integrator is coupled to be reset in response to closing the switch 362, and each ramp in the ramp signal VRAMP 316 is coupled to be begin at the output of the operational amplifier 358 when the switch 362 is opened.

In operation, ultra-high resolution analog fine gain is realized with ramp generator 314 using fractional divider 336, which includes a delta-sigma modulator to generate the switched capacitor control signal sc_ctrl ($f_{sc}$) 340 and switched capacitor control signal sc_ctrl_b 348 ($f_{sc}$) to control the switching of the switched capacitor circuits 341 and 343 that include capacitors 354 and 356, respectively. As will be discussed, the ultra-high resolution analog fine gain is achieved by changing the charging capacitor current $I_{cpp}$ 331 in response to adjusting fractional divider ratio K of the fractional divider 336 in accordance with the teachings of the present invention. In the example, the charging capacitor current $I_{cap}$ 331 is generated by the switching of the switched capacitor circuits 341 and 343. In particular, the charging capacitor current $I_{cap}$ 331 is defined in Equation (3) below:

$$I_{cap} = f_{sc} C_0 V_{cap} \quad (3)$$

where the switched capacitor control signal sc_ctrl ($f_{sc}$) 340 and switched capacitor control signal sc_ctrl_b ($f_{sc}$) 348 have a switch frequency of $f_{sc}$, the capacitance values of capacitors 354 and 356 are both equal to $C_0$, and the voltage across the capacitors 354 and 356 of the switched capacitor circuits is $V_{cap}$. Since the current $I_{cpp}$ 331 through path 329 is mirrored to path 333 with the current mirror, the integrator current $I_{integ}$ 335 is defined in Equation (4) below:

$$I_{integ} = \frac{N}{M} f_{sc} C_0 V_{cap} \frac{N}{M} \frac{f_{pll}}{K} C_0 V_{cap} \quad (4)$$

where N represents the relative channel width of transistor 330, M represents the relative channel width of transistor 328, $f_{pll}$ is the frequency of the phase lock loop clock signal (PLL_CLK) 338 received by the fractional divider 336, and K is the adjustable fractional divider ratio of the fractional divider circuit 336.

Assuming $V_{cap}$, $C_0$, N, and M are constant, then ultra-high resolution fine gain is realized by ramp generator circuit 314 by adjusting fractional divider ratio K. As such, the gain of the ramp generator circuit 314 is defined by the relationship of Equation (5)

$$GAIN = \frac{K}{K|_{gain=1}} \quad (5)$$

Thus, assuming for example a fractional divider ratio K=8 provides a fine gain equal to 1, then a fractional divider ratio K=16 would provide a gain of 16/8=2 according to Equation (5). Similarly, a gain of 1 1/32 is provided with K=8.25 since 8.25/8=1 1/32, a gain of 1 2/32 is provided with K=8.5 since 8.5/8=1 2/32, and so on. Therefore, ultra-high resolution fine gain is realized by ramp generator circuit 314 by adjusting fractional divider ratio K in accordance with the teachings of the present invention.

Figure 3B:
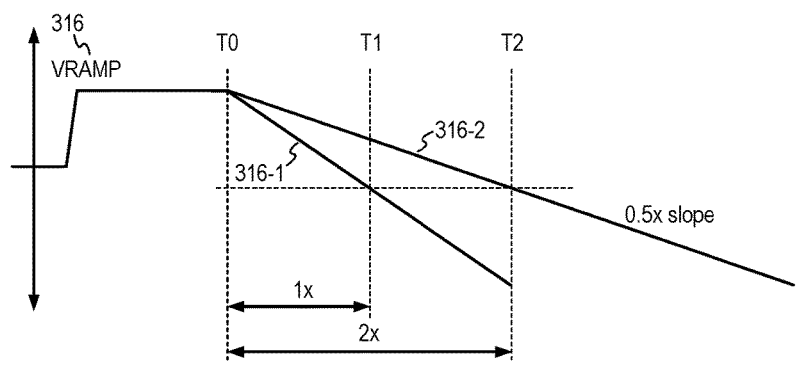
FIG. 3B illustrates a one example of output ramp signals having adjustable gain settings provided by a ramp generator having high resolution analog fine gain using a fractional divider with a delta-sigma modulator in accordance with the teachings of the present disclosure.

FIG. 3B illustrates a one example of output ramp signals VRAMP 316 for which the fractional divider ratio K settings are adjusted to achieve high resolution analog fine gain in a ramp generator using a fractional divider with a delta-sigma modulator in accordance with the teachings of the present disclosure. As discussed above in Equation (2), gain is inversely proportional to the slope. Thus, the gain of ramp signal 316-2 is twice the gain of ramp signal 316-1 since the slope of ramp signal 316-2 is 0.5× the slope of ramp signal 316-1. In an example in which a fractional divider ratio K=8 provides a fine gain equal to 1 to provide ramp signal 316-1, then in that example K is adjusted to K=16 to provide ramp signal 316-2 with a fine gain equal to 2 or a slope of 0.5× in accordance with the teachings of the present invention.

Figure 4A:
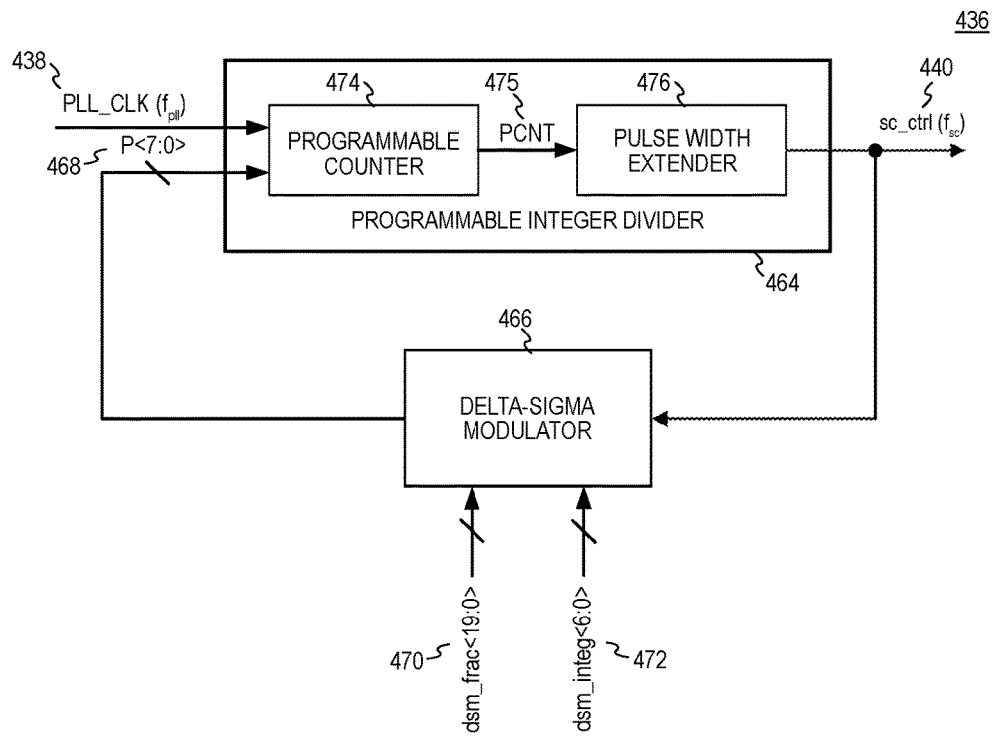
FIG. 4A shows one example diagram of a fractional divider with a delta-sigma modulator in accordance with the teachings of the present disclosure.

FIG. 4A shows one example diagram of a fractional divider 436 with a delta-sigma modulator in accordance with the teachings of the present disclosure. It is appreciated the fractional divider 436 of FIG. 4A may be one example of the fractional divider 336 as shown in FIG. 3A, and that similarly named and numbered elements described above are coupled and function similarly below. In the example depicted in FIG. 4A, fractional divider 436 includes a programmable integer divider 464, which is coupled to receive a clock signal PLL_CLK ($f_{pll}$) 438 and an output integer signal P<7:0>468. In operation, the programmable integer divider 464 is coupled to divide down the clock signal PLL_CLK ($f_{pll}$) 438 by a factor responsive to the output integer signal P<7:0>468 to generate the switched capacitor control signal sc_ctrl ($f_{sc}$) 440. A delta-sigma modulator 466 is coupled to receive a fractional modulus signal dsm_frac<19:0>472 and an input integer signal dsm_integ<6:0>470 to generate the output integer signal P<7:0>468. In the example, the output integer signal P<7:0>468 generated by the delta-sigma modulator 466 is a varying signal each cycle of the switched capacitor control signal sc_ctrl ($f_{sc}$) 440 having a long term average DC value over time that is substantially equal to the fractional divider ratio K.

In operation, the high resolution fine gain provided by the ramp generator 314 is responsive to the fractional divider ratio K as described above with respect to Equation (5) in accordance with the teachings of the present invention. As will be described in greater detail below, in one example, the accumulators included in delta-sigma modulator 466 are cascaded 20-bit overflowing accumulators. Thus, the fractional divider ratio K can be defined with Equation (6) as follows:

$$K = P_{avg} = \text{dsm\_integ} < 6:0 > + \frac{\text{dsm\_frac} < 19:0 >}{2^{20}} \quad (6)$$

where $P_{avg}$ is an integer number whose long term DC average value is the fractional divider ratio K, dsm_integ<6:0> is an input integer signal, and dsm_frac<19:0> is a fractional modulus signal. Therefore, the long term average frequency $f_{sc,avg}$ of the switched capacitor control signal sc_ctrl 440 can be defined with Equation (7) as follows:

$$f_{sc,avg} = \frac{f_{pll}}{P_{avg}} = \frac{f_{pll}}{K} \quad (7)$$

where $f_{pll}$ is the switching frequency of the clock signal PLL_CLK 438.

Continuing with the example depicted in FIG. 4A, the programmable integer divider 464 includes a programmable counter 474 coupled to receive the clock signal PLL_CLK ($f_{pll}$) 438 and the output integer signal P<7:0>468 from the delta-sigma modulator 466 to generate a programmable counter output signal PCNT 475. In the example, the programmable counter output signal PCNT 475 signal includes a plurality of short pulses. A pulse width extender 476 is coupled to receive the programmable counter output signal PCNT 475 to generate the switched capacitor control signal sc_ctrl ($f_{sc}$) 440, which as described above is utilized to control the switched capacitor circuits 341 and 343 in FIG. 3A. In operation, the pulse width extender 476 is configured to extend each one of the plurality of short pulses in the programmable counter output signal PCNT 475 to a fixed duration for each first state (e.g., each logic high state) of the switched capacitor control signal sc_ctrl ($f_{sc}$) 440, while each second state (e.g. each logic low state) of the switched capacitor control signal sc_ctrl ($f_{sc}$) 440 has a variable duration.

Figure 4B:
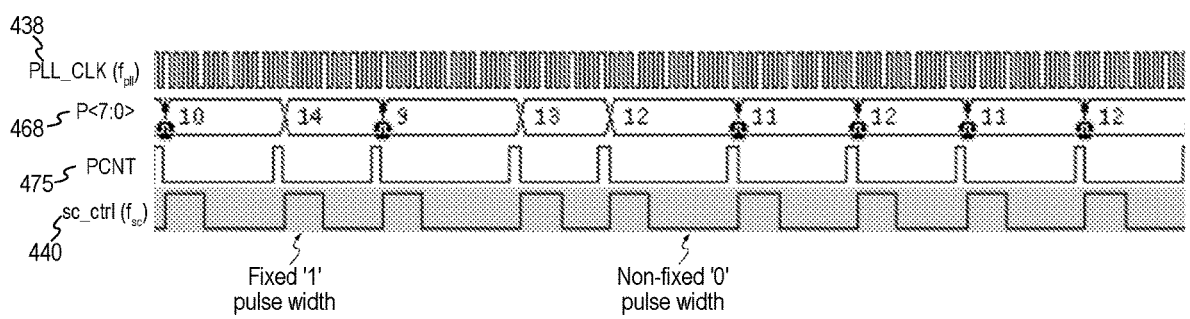
FIG. 4B shows one example of signals in a fractional divider with a delta-sigma modulator in accordance with the teachings of the present disclosure.

To illustrate, FIG. 4B shows one example of signals found in a fractional divider 436 with a delta-sigma modulator 466 in accordance with the teachings of the present disclosure. As shown in FIG. 4B, the clock signal PLL_CLK ($f_{pll}$) 438 is a high frequency pulse train of short pulses. The output integer signal P<7:0>468 generated by the delta-sigma modulator 466 is a varying integer value signal each cycle of the switched capacitor control signal sc_ctrl ($f_{sc}$) 440. The long term average DC value overtime of output integer signal P<7:0>468 is substantially equal to the fractional divider ratio K. The programmable counter output signal PCNT 475 is a plurality of short pulses, which in the illustrated example have a pulse width equal to 1 input clock cycle of the clock signal PLL_CLK ($f_{pll}$) 438. The switched capacitor control signal sc_ctrl ($f_{sc}$) 440 is generated by pulse width extender 476 in response to the programmable counter output signal PCNT 475. In the example, the pulse width extender 476 extends each short pulse of the programmable counter output signal PCNT 475 to a certain fixed '1' pulse width.

It is appreciated that one key consideration of the fixed '1' pulse width of each pulse in the switched capacitor control signal sc_ctrl ($f_{sc}$) 440 is to maintain good linearity and ensure that each capacitor 354 and 356 of switched capacitor circuits 341 and 343 in FIG. 3A can be fully charged within each fixed pulse width for each '1' pulse of switched capacitor control signal sc_ctrl ($f_{sc}$) 440, and fully discharged within each non-fixed or variable pulse width for each '0' pulse of switched capacitor control signal sc_ctrl ($f_{sc}$) 440.

In the various examples, the switched capacitor control signal sc_ctrl ($f_{sc}$) 440 generated by fractional divider 436 has a skewed duty cycle, while maintaining the fixed width '1' pulse and the non-fixed or variable pulse width '0' pulse as shown in FIG. 4B. Thus, in various examples, the minimum period for each period switched capacitor control signal sc_ctrl ($f_{sc}$) 440 is at least twice the width of the fixed '1' pulse width. Stated in another way, in one example, the maximum the duty cycle for each period of switched capacitor control signal sc_ctrl ($f_{sc}$) 440 is 50%.

Figure 5A:
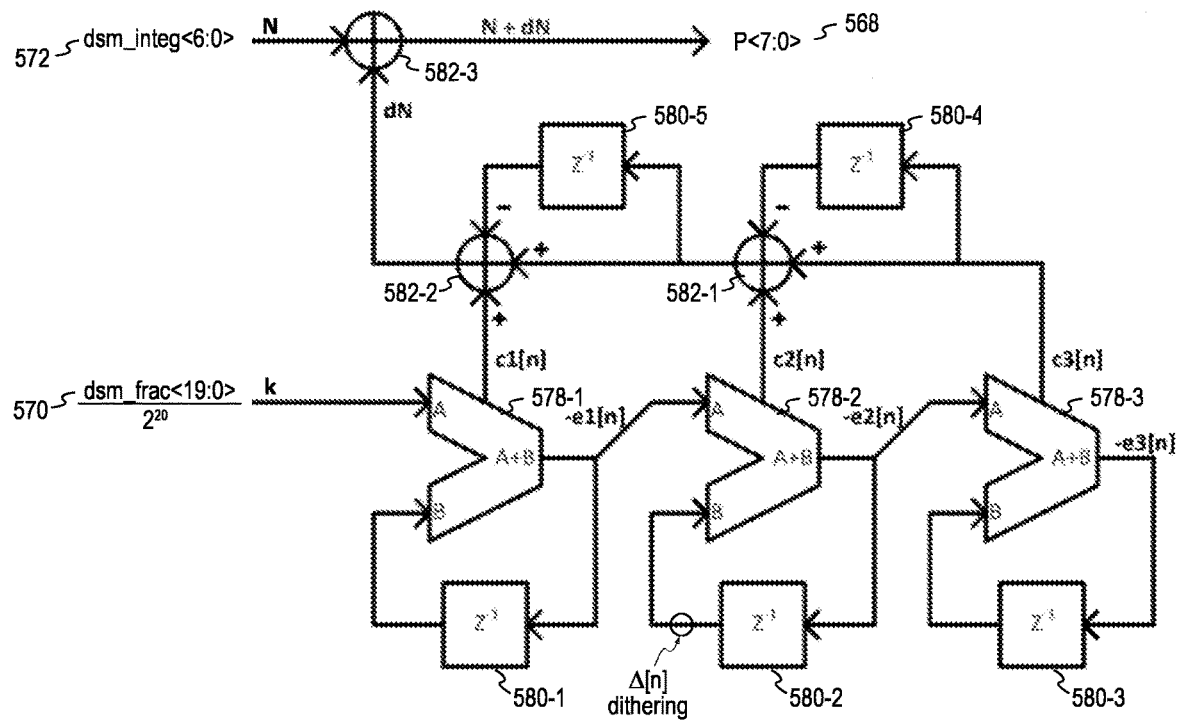
FIG. 5A shows one example diagram of a delta-sigma modulator in accordance with the teachings of the present disclosure.

FIG. 5A shows one example diagram of a delta-sigma modulator 566 in accordance with the teachings of the present disclosure. It is appreciated the delta-sigma modulator 566 of FIG. 5A may be one example of the delta-sigma modulator 466 of FIG. 4A, or of a delta-sigma modulator included in fractional divider 336 of FIG. 3A, and that similarly named and numbered elements described above are coupled and function similarly below. As can be appreciated, the delta-sigma modulator 566 illustrated in FIG. 5A is an example of a third order multi-stage noise shaping (MASH) delta-sigma modulator with dithering including three cascaded overflowing accumulators, each of which is equivalent to a first-order delta-sigma modulator. In the example, the carry outputs are combined through summations and z-transform function blocks or delays as shown to generate the output integer signal P<7:0>568, which is a pseudo-random sequence having a long term average DC value over time substantially equal to the fractional divider ratio K. In other examples, it is appreciated that delta-sigma modulator 566 may be implemented using other suitable delta-sigma or sigma-delta modulator structures in accordance with the teachings of the present invention.

As shown in the example illustrated in FIG. 5A, delta-sigma modulator 566 includes a first accumulator 578-1 having a first input A coupled to receive the fractional modulus signal dsm_frac<19:0>570 (which is also referred to as "k" in FIG. 5A), and a second input B coupled to receive an output A+B of the first accumulator 578-1 through a first z-transform function block 580-1. A second accumulator 578-2 includes a first input A that is coupled to receive the output A+B of the first accumulator 578-1, and a second input B that is coupled to receive an output A+B of the second accumulator 578-2 through a second z-transform function block 580-2. A third accumulator 578-3 includes a first input A that is coupled to receive the output A+B of the second accumulator 578-2, and a second input B that is coupled to receive an output A+B of the third accumulator 578-3 through a third z-transform function block 580-3. A first summation block 582-1 is coupled to add a carry output c2[n] of the second accumulator 578-2, add a carry output c2[3] of the third accumulator 578-3, and subtract an output of a fourth z-transform function 580-4 block coupled to the carry output c3[n] of the third accumulator 578-3. A second summation block 582-2 is coupled to add a carry output c1[n] of the first accumulator 578-1, add an output of the first summation block 582-1, and subtract an output of a fifth z-transform function block 580-5 coupled to the output of the first summation block 582-1. A third summation block 582-3 is coupled to add the input integer signal dsm_integ<6:0> (which is also referred to as "N" in FIG. 5A) to an output of the second summation block 582-2 to generate the output integer signal P<7:0>.

In operation, each stage of delta-sigma modulator 566 cancels the quantization noise $e_x[n]$ of the previous stage. Thus, the remaining e3[n] quantization noise is the quantization noise of the delta-sigma modulator 566, which is shaped by the third-order high pass filtering provided with three stage delta-sigma modulator 566 example shown in FIG. 5A. It is noted that the Δ[n] dithering output by the second z-transform block 580-2 to the B input of the second accumulator 578-2 is 1-bit pseudo random binary sequence (PRBS) dithering noise that is shaped by a second order high pass. Thus, it is also noted that the input dN of the third summation block 582-3 can be characterized with Equation (8) as follows:

$$dN = k + e3[n](1-z^{-1})^3 + \Delta[n](1-z^{-1})^2 \qquad (7)$$

where dN is representative of the output of the second summation block 582-2, k is representative of the input A of the first accumulator 578-1, and Δ[n] is representative of the dithering output from the second z-transform block 580-2.

Figure 5B:
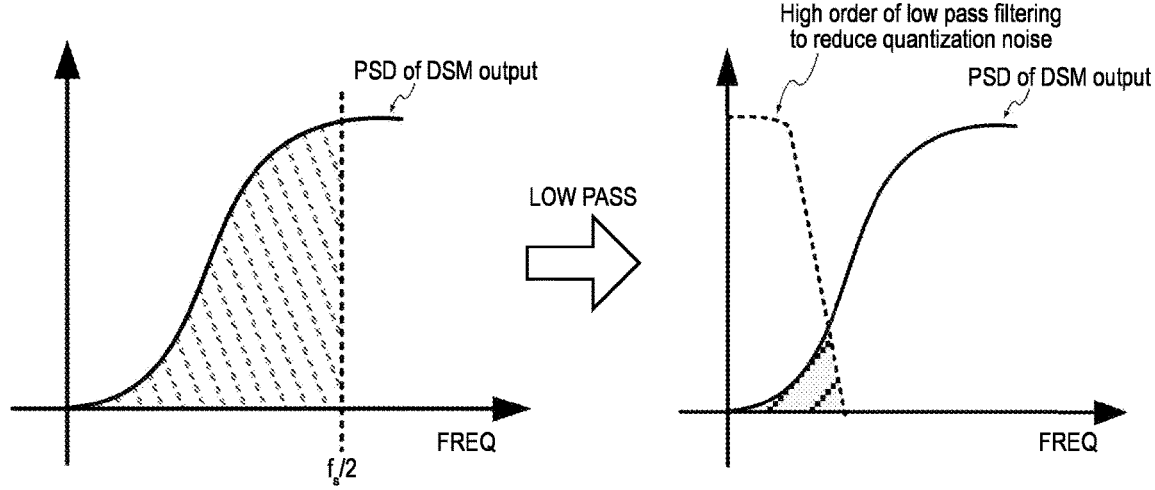
FIG. 5B shows one example diagram of the power spectral density a delta-sigma modulator in relation to high order low pass filtering to reduce quantization noise in accordance with the teachings of the present disclosure.

FIG. 5B shows one example diagram of the power spectral density (PSD) of delta-sigma modulator 566 output in relation to the provided high order low pass filtering that reduces the effects of the quantization noise in accordance with the teachings of the present disclosure. In particular, the graph on the left side of FIG. 5B shows that the power spectral density of the output of delta-sigma modulator 566 has peak energy near the Nyquist frequency, which is at around half of the sampling frequency or $f_s/2$. It is appreciated that quantization noise will impact an image sensor's row temporal noise (RTN). However, the delta-sigma modulator 566 in accordance with the teachings of the present invention shapes the quantization noise such that a majority of the quantization noise is pushed to a higher frequency region as shown in the graph left side of FIG. 5B. In addition, an imaging system example in accordance with the teachings of the present invention has multiple poles (e.g., switched capacitor circuits, current mirror, ramp buffer operational amplifiers, comparators, etc.), which serve as (at least) a 4th order of low pass filtering that help to reduce the effects of the noise as illustrated in the graph on the right side of FIG. 5B. As illustrated, the high order low pass filtering reduces the effects of the quantization noise since the majority of the quantization noise is pushed to a higher frequency region in accordance with the teachings of the present disclosure.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A ramp generator providing ramp signal with high resolution fine gain, comprising:
   a current mirror having a first path coupled to conduct a capacitor current, and a second path coupled to conduct an integrator current responsive to the capacitor current;
   a first switched capacitor circuit and a second switched capacitor circuit coupled to the first path;
   a fractional divider circuit coupled to receive a clock signal to generate in response to an adjustable fractional divider ratio K a switched capacitor control signal that oscillates between first and second states to control the first and second switched capacitor circuits, wherein the first switched capacitor circuit is coupled to be charged by the capacitor current and the second switched capacitor circuit is coupled to be discharged in response to each first state of the switched capacitor control signal, wherein the first switched capacitor circuit is coupled to be discharged and the second switched capacitor circuit is coupled to be charged by the capacitor current in response to each second state of the switched capacitor control signal; and
   an integrator coupled to the second path to generate the ramp signal in response to the integrator current.

2. The ramp generator of claim 1, wherein the first switched capacitor circuit comprises:
   a first capacitor;
   a first switch coupled between the first capacitor and the first path, wherein the first switch is configured to be turned on in response to the first state and turned off in response to the second state; and
   a second switch coupled across the first capacitor, wherein the second switch is configured to be turned off in response to the first state and turned on in response to the second state.

3. The ramp generator of claim 2, wherein the second switched capacitor circuit comprises:
   a second capacitor;
   a third switch coupled between the second capacitor and the first path, wherein the third switch is configured to be turned off in response to the first state and turned on in response to the second state; and
   a fourth switch coupled across the second capacitor, wherein the fourth switch is configured to be turned on in response to the first state and turned off in response to the second state.

4. The ramp generator of claim 1, wherein the current mirror comprises:
   a first transistor coupled between a voltage supply rail and the first path, wherein a control terminal of the first transistor is coupled to the first path; and
   a second transistor coupled between the voltage supply rail and the second path, wherein a control terminal of the second transistor is coupled to the control terminal of the first transistor.

5. The ramp generator of claim 4, further comprising:
   a first operational amplifier having a non-inverting input coupled to a reference capacitor voltage; and
   a third transistor coupled between the first transistor and the first switched capacitor circuit, the second switched capacitor circuit, and the inverting input of the first operational amplifier through the first path, wherein a control terminal of the third transistor is coupled to an output of the first operational amplifier, and wherein the first operational amplifier is coupled to turn off the third transistor in response to a voltage at the first switched capacitor circuit and the second switched capacitor circuit reaching the reference capacitor voltage.

6. The ramp generator of claim 1, wherein the integrator comprises:
   a second operational amplifier having a non-inverting input coupled to a reference voltage;
   a third capacitor coupled between an inverting input of the second operational amplifier and an output of the second operational amplifier; and
   a third switch coupled between the inverting input of the second operational amplifier and the output of the second operational amplifier, wherein the integrator is coupled to be reset in response to the third switch, and wherein the ramp signal is coupled to be generated at the output of the second operational amplifier.

7. The ramp generator of claim 1, wherein the fractional divider circuit comprises:
   a programmable integer divider coupled to receive a clock signal and an output integer signal, wherein the programmable integer divider is coupled to divide down the clock signal by a factor responsive to the output integer signal to generate the switched capacitor control signal; and
   a delta-sigma modulator coupled to receive a fractional modulus signal and an input integer signal to generate the output integer signal, wherein the output integer signal is a varying signal each cycle of the switched capacitor control signal and having a long term average DC value substantially equal to the fractional divider ratio K, wherein the high resolution fine gain provided by the ramp generator is responsive to the fractional divider ratio K.

8. The ramp generator of claim 7, wherein the programmable integer divider comprises:
a programmable counter coupled to receive the clock signal and the output integer signal from the delta-sigma modulator to generate a programmable counter output signal, wherein the programmable counter output signal includes a plurality of pulses; and
a pulse width extender coupled to receive the programmable counter output signal to generate the switched capacitor control signal, wherein pulse width extender is configured to extend each one of the plurality of pulses in the programmable counter output signal to a fixed duration for each first state of the switched capacitor control signal, and wherein each second state of the switched capacitor control signal has a variable duration.

9. The ramp generator of claim 8, wherein each first state of the switched capacitor control signal is a logic high signal value, and wherein each second state of the switched capacitor control signal is a logic low signal value.

10. The ramp generator of claim 7, wherein the delta-sigma modulator comprises a third-order delta-sigma modulator.

11. The ramp generator of claim 10, wherein the third-order delta-sigma modulator comprises:
a first accumulator having a first input coupled to receive the fractional modulus signal, and a second input coupled to receive an output of the first accumulator through a first z-transform function block;
a second accumulator having a first input coupled to receive the output of the first accumulator, and a second input coupled to receive an output of the second accumulator through a second z-transform function block;
a third accumulator having a first input coupled to receive the output of the second accumulator, and a second input coupled to receive an output of the third accumulator through a third z-transform function block;
a first summation block coupled to add a carry output of the second accumulator, add a carry output of the third accumulator, and subtract an output of a fourth z-transform function block coupled to the carry output of the third accumulator;
a second summation block coupled to add a carry output of the first accumulator, add an output of the first summation block, and subtract an output of a fifth z-transform function block coupled to the output of the first summation block; and
a third summation block coupled to add the input integer signal to an output of the second summation block to generate the output integer signal.

12. An imaging system, comprising:
a pixel array including a plurality of pixel circuits arranged in a plurality of rows and a plurality of columns, wherein each one of the pixel circuits is coupled to generate an image signal in response to incident light;
a control circuitry coupled to the pixel array to control operation of the pixel array; and
a readout circuitry coupled to the pixel array to read out the image data from the plurality of pixel cells through bitlines, wherein the readout circuitry comprises
column comparators coupled to the bitlines to receive the image data from the plurality of pixels and further coupled to receive a ramp signal during an analog to digital conversion operation to provide a digital representation of the image data in response; and
a ramp generator coupled to generate the ramp signal with high resolution fine gain in response to an adjustable fractional divider ratio K, the ramp generator comprising:
a current mirror having a first path coupled to conduct a capacitor current, and a second path coupled to conduct an integrator current responsive to the capacitor current;
a first switched capacitor circuit and a second switched capacitor circuit coupled to the first path;
a fractional divider circuit coupled to receive a clock signal to generate in response to the fractional divider ratio K a switched capacitor control signal that oscillates between first and second states to control the first and second switched capacitor circuits, wherein the first switched capacitor circuit is coupled to be charged by the capacitor current and the second switched capacitor circuit is coupled to be discharged in response to each first state of the switched capacitor control signal, wherein the first switched capacitor circuit is coupled to be discharged and the second switched capacitor circuit is coupled to be charged by the capacitor current in response to each second state of the switched capacitor control signal; and
an integrator coupled to the second path to generate the ramp signal in response to the integrator current.

13. The imaging system of claim 12, further comprising function logic coupled to the readout circuitry to store the image data read out from the pixel array.

14. The imaging system of claim 12, wherein the first switched capacitor circuit comprises:
a first capacitor;
a first switch coupled between the first capacitor and the first path, wherein the first switch is configured to be turned on in response to the first state and turned off in response to the second state; and
a second switch coupled across the first capacitor, wherein the second switch is configured to be turned off in response to the first state and turned on in response to the second state.

15. The imaging system of claim 14, wherein the second switched capacitor circuit comprises:
a second capacitor;
a third switch coupled between the second capacitor and the first path, wherein the third switch is configured to be turned off in response to the first state and turned on in response to the second state; and
a fourth switch coupled across the second capacitor, wherein the fourth switch is configured to be turned on in response to the first state and turned off in response to the second state.

16. The imaging system of claim 12, wherein the current mirror comprises:
a first transistor coupled between a voltage supply rail and the first path, wherein a control terminal of the first transistor is coupled to the first path; and a second transistor coupled between the voltage supply rail and the second path, wherein a control terminal of the second transistor is coupled to the control terminal of the first transistor.

17. The imaging system of claim 16, wherein the ramp generator further comprises:
a first operational amplifier having a non-inverting input coupled to a reference capacitor voltage; and
a third transistor coupled between the first transistor and the first switched capacitor circuit, the second switched capacitor circuit, and the inverting input of the first operational amplifier through the first path, wherein a control terminal of the third transistor is coupled to an output of the first operational amplifier, and wherein the first operational amplifier is coupled to turn off the third transistor in response to a voltage at the first switched capacitor circuit and the second switched capacitor circuit reaching the reference capacitor voltage.

18. The imaging system of claim 12, wherein the integrator comprises:
a second operational amplifier having a non-inverting input coupled to a reference voltage;
a third capacitor coupled between an inverting input of the second operational amplifier and an output of the second operational amplifier; and
a third switch coupled between the inverting input of the second operational amplifier and the output of the second operational amplifier, wherein the integrator is coupled to be reset in response to the third switch, and wherein the ramp signal is coupled to be generated at the output of the second operational amplifier.

19. The imaging system of claim 12, wherein the fractional divider circuit comprises:
a programmable integer divider coupled to receive a clock signal and an output integer signal, wherein the programmable integer divider is coupled to divide down the clock signal by a factor responsive to the output integer signal to generate the switched capacitor control signal; and
a delta-sigma modulator coupled to receive a fractional modulus signal and an input integer signal to generate the output integer signal, wherein the output integer signal is a varying signal each cycle of the switched capacitor control signal and having a long term average DC value substantially equal to the fractional divider ratio K, wherein the high resolution fine gain provided by the ramp generator is responsive to the fractional divider ratio K.

20. The imaging system of claim 19, wherein the programmable integer divider comprises:
a programmable counter coupled to receive the clock signal and the output integer signal from the delta-sigma modulator to generate a programmable counter output signal, wherein the programmable counter output signal includes a plurality of pulses; and
a pulse width extender coupled to receive the programmable counter output signal to generate the switched capacitor control signal, wherein pulse width extender is configured to extend each one of the plurality of pulses in the programmable counter output signal to a fixed duration for each first state of the switched capacitor control signal, and wherein each second state of the switched capacitor control signal has a variable duration.

21. The imaging system of claim 20, wherein each first state of the switched capacitor control signal is a logic high signal value, and wherein each second state of the switched capacitor control signal is a logic low signal value.

22. The imaging system of claim 19, wherein the delta-sigma modulator comprises a three stage delta-sigma modulator.

23. The imaging system of claim 22, wherein the three stage delta-sigma modulator comprises:
a first accumulator having a first input coupled to receive the fractional modulus signal, and a second input coupled to receive an output of the first accumulator through a first z-transform function block;
a second accumulator having a first input coupled to receive the output of the first accumulator, and a second input coupled to receive an output of the second accumulator through a second z-transform function block;
a third accumulator having a first input coupled to receive the output of the second accumulator, and a second input coupled to receive an output of the third accumulator through a third z-transform function block;
a first summation block coupled to add a carry output of the second accumulator, add a carry output of the third accumulator, and subtract an output of a fourth z-transform function block coupled to the carry output of the third accumulator;
a second summation block coupled to add a carry output of the first accumulator, add an output of the first summation block, and subtract an output of a fifth z-transform function block coupled to the output of the first summation block; and
a third summation block coupled to add the input integer signal to an output of the second summation block to generate the output integer signal.

* * * * *